(12) United States Patent
Lin et al.

(10) Patent No.: US 11,257,845 B2
(45) Date of Patent: Feb. 22, 2022

(54) RADIO FREQUENCY INTEGRATED CIRCUIT HAVING RELATIVELY SMALL CIRCUIT AREA AND METHOD OF FABRICATING THE SAME

(71) Applicant: NATIONAL CHIAO TUNG UNIVERSITY, Hsinchu (TW)

(72) Inventors: Horng-Chih Lin, Hsinchu (TW); Yu-An Huang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 16/940,093

(22) Filed: Jul. 27, 2020

(65) Prior Publication Data
US 2021/0375946 A1  Dec. 2, 2021

(30) Foreign Application Priority Data
Jun. 1, 2020 (TW) .................................. 109118286

(51) Int. Cl.
*H01L 27/12* (2006.01)
*H01L 29/66* (2006.01)
*H01L 29/423* (2006.01)
*H01L 23/66* (2006.01)

(52) U.S. Cl.
CPC .......... *H01L 27/1207* (2013.01); *H01L 23/66* (2013.01); *H01L 29/42384* (2013.01); *H01L 29/66757* (2013.01)

(58) Field of Classification Search
CPC ........... H01L 27/1207; H01L 29/66757; H01L 23/66; H01L 29/42384

USPC .......................................................... 257/43
See application file for complete search history.

(56) References Cited

U.S. PATENT DOCUMENTS

| 5,089,863 A | 2/1992 | Satoh et al. |
| 6,063,678 A | 5/2000 | D'Anna |
| 9,947,662 B2 | 4/2018 | Stribley et al. |
| 2007/0001239 A1* | 1/2007 | Deleonibus ....... H01L 29/42376 257/408 |
| 2009/0078966 A1* | 3/2009 | Asai .................... H01L 29/7783 257/194 |
| 2015/0318185 A1* | 11/2015 | Kodaira ............ H01J 37/32339 438/9 |
| 2017/0077310 A1* | 3/2017 | Oda .................. H01L 29/66757 |
| 2020/0266190 A1* | 8/2020 | Radosavljevic .. H01L 29/66636 |

FOREIGN PATENT DOCUMENTS

| TW | 405167 B | 9/2000 |
| TW | 201941402 A | 10/2019 |

OTHER PUBLICATIONS

Search Report appended to an Office Action, which was issued to Taiwanese counterpart application No. 109118286 by the TIPO dated Nov. 9, 2020, with an English translation thereof.
(Continued)

*Primary Examiner* — Duy T Nguyen (57) ABSTRACT

A radio frequency integrated circuit includes a silicon CMOS substrate with at least one CMOS device buried therein, and at least one thin film transistor formed on the silicon CMOS substrate and functioning as a radio frequency device. The thin film transistor includes a T-shaped gate electrode. A method for the fabricating a radio frequency integrated circuit is also disclosed.

10 Claims, 10 Drawing Sheets

(56) References Cited

OTHER PUBLICATIONS

Z. Y. Yang1, et al., "Radio-frequency Superiority of Poly-Si TFTs with T-Shaped Gate and Air Spacers for IoT Applications," IEEE Electron Devices Technology and Manufacturing Conference Proceedings of Technical Papers (2018).

* cited by examiner

RADIO FREQUENCY INTEGRATED CIRCUIT HAVING RELATIVELY SMALL CIRCUIT AREA AND METHOD OF FABRICATING THE SAME

CROSS-REFERENCE TO RELATED APPLICATION

This application claims priority from Taiwanese invention patent application no. 109118286, filed on Jun. 1, 2020.

FIELD

The disclosure relates to an integrated circuit, more particularly to a radio frequency integrated circuit.

BACKGROUND

In a conventional integrated circuit, radio frequency devices and CMOS (complementary metal-oxide-semiconductor) devices are simultaneously built in a silicon substrate and displaced from each other in a horizontal direction, and thus the silicon substrate is required to have an enlarged dimension. In this case, the manufacturing cost is relatively high and the conventional integrated circuit is not designed in a compact manner.

SUMMARY

An object of the disclosure is to provide a novel radio frequency integrated circuit which has a relatively compact structure and which has a silicon CMOS substrate and at least one radio frequency device stacked on the silicon CMOS substrate in a vertical direction.

According to a first aspect of the disclosure, a radio frequency integrated circuit includes a silicon CMOS substrate with at least one CMOS device buried therein, and at least one thin film transistor formed on the silicon CMOS substrate and functioning as a radio frequency device. The thin film transistor includes a T-shaped gate electrode.

According to a second aspect of the disclosure, a method for fabricating a radio frequency integrated circuit includes the steps of:

a) forming at least one CMOS device in a silicon. substrate;

b) forming an inter-level dielectric layer on the silicon substrate to cover the at least one CMOS device;

c) forming a patterned active region on the inter-level dielectric layer;

d) forming a gate insulator layer on the inter-level dielectric layer to cover the patterned active region;

e) forming a conductive layer on the gate insulator layer, the conductive layer including a lower conductive sublayer which is attached to the gate insulator layer, and an upper conductive sublayer which is stacked on the lower conductive sublayer and which is made of a material different from that of the lower conductive sublayer;

f) forming a patterned etching mask on the conductive layer in a position corresponding to the patterned active region;

g) etching the conductive layer exposed from the patterned etching mask to form a T-shaped gate electrode;

h) after steps g), removing the patterned etching mask;

i) patterning the gate insulator layer to form a patterned gate insulator layer interposed between the T-shaped gate electrode and the patterned active region; and j) doping an upper electrode section of the T-shaped gate electrode, and doping the patterned active region to form a source region and a drain region therein at two opposite sides of the T-shaped gate electrode while a channel region is formed between the source and drain regions and beneath the patterned gate insulator layer.

BRIEF DESCRIPTION OF THE DRAWINGS

Other features and advantages of the disclosure will become apparent in the following detailed description of the embodiment (s) with reference to the accompanying drawings, in which.

DETAILED DESCRIPTION

Before the disclosure is described in greater detail, it should be noted that where considered appropriate, reference numerals have been repeated among the figures to indicate corresponding or analogous elements, which may optionally have similar characteristics.

Figure 8:
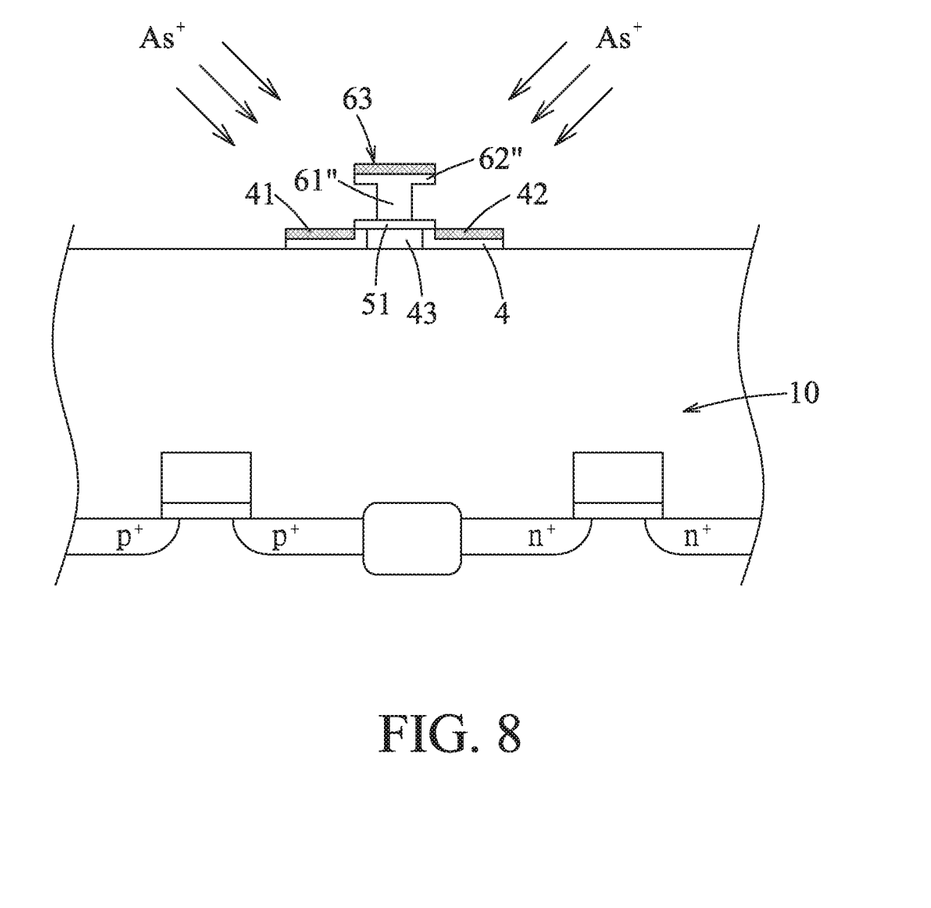
Figure 9:
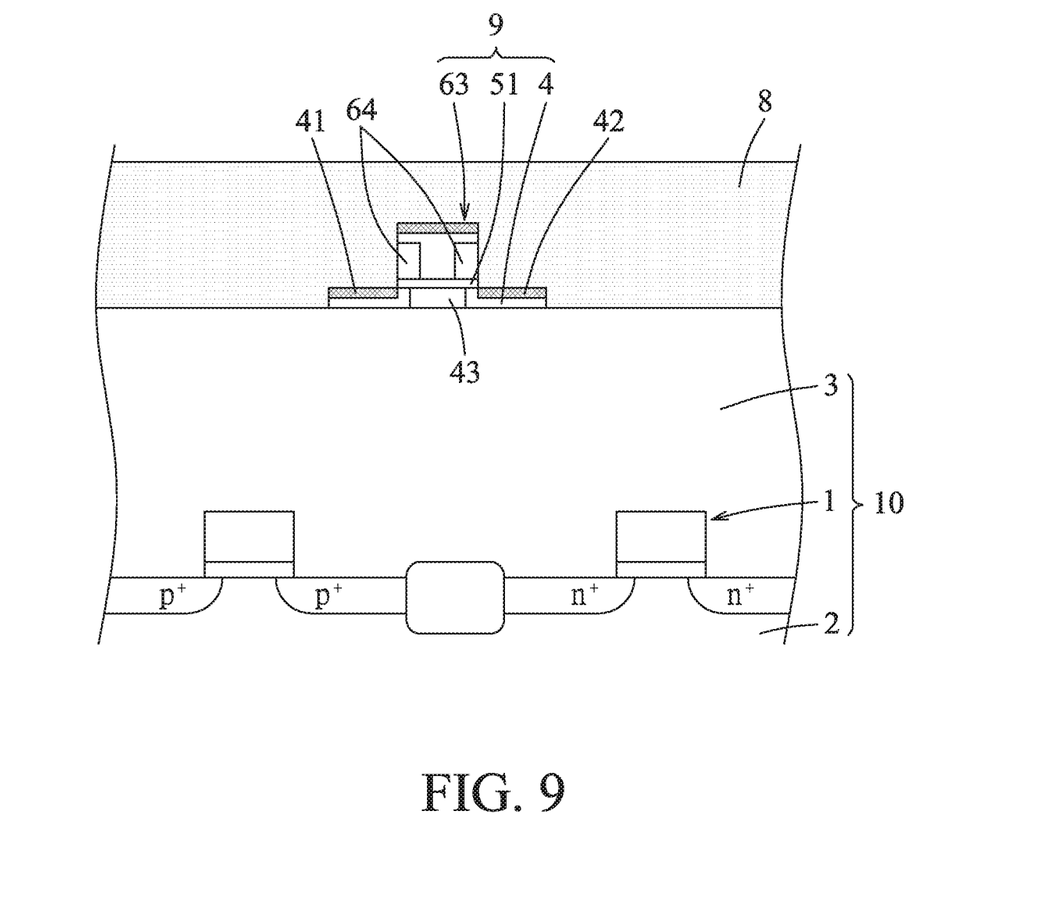

Referring to FIGS. 8 and 9, a radio frequency integrated circuit according to an embodiment of the disclosure is shown to include a silicon CMOS substrate 10 and at least one thin film transistor 9.

The silicon CMOS substrate 10 has at least one CMOS (complementary metal-oxide-semiconductor) device buried therein. In an embodiment shown in FIG. 9, the silicon CMOS substrate 10 includes a silicon substrate 2, the at least one CMOS device 1 formed in the silicon substrate 2, and an inter-level dielectric layer 3 formed on the silicon substrate 2 to cover the at least one CMOS device 1.

The thin film transistor 9 is formed on the silicon CMOS substrate 10 and functions as a radio frequency device. The thin film transistor 9 includes a T-shaped gate electrode 63.

In an embodiment shown in FIG. 9, the thin film transistor 9 has a semiconductive channel 43 which may be made of a material selected from the group consisting of polysilicon, ZnO, IGZO, and MON.

In an embodiment shown in FIG. 9, the radio frequency integrated circuit may further include a passivation layer 8 formed on the silicon CMOS substrate 10 to cover the T-shaped gate electrode 63 in a way that two air spacers 64 are formed respectively beneath two wing portions of the T-shaped gate electrode 63.

In an embodiment shown in FIGS. 8 and 9, the T-shaped gate electrode 63 includes an $n^+$-doped polysilicon lower electrode section 61", and a boron-doped polysilicon upper electrode section 62" which has the wing portions and which is wide than the $n^+$-doped polysilicon upper electrode section 61".

Figure 10:
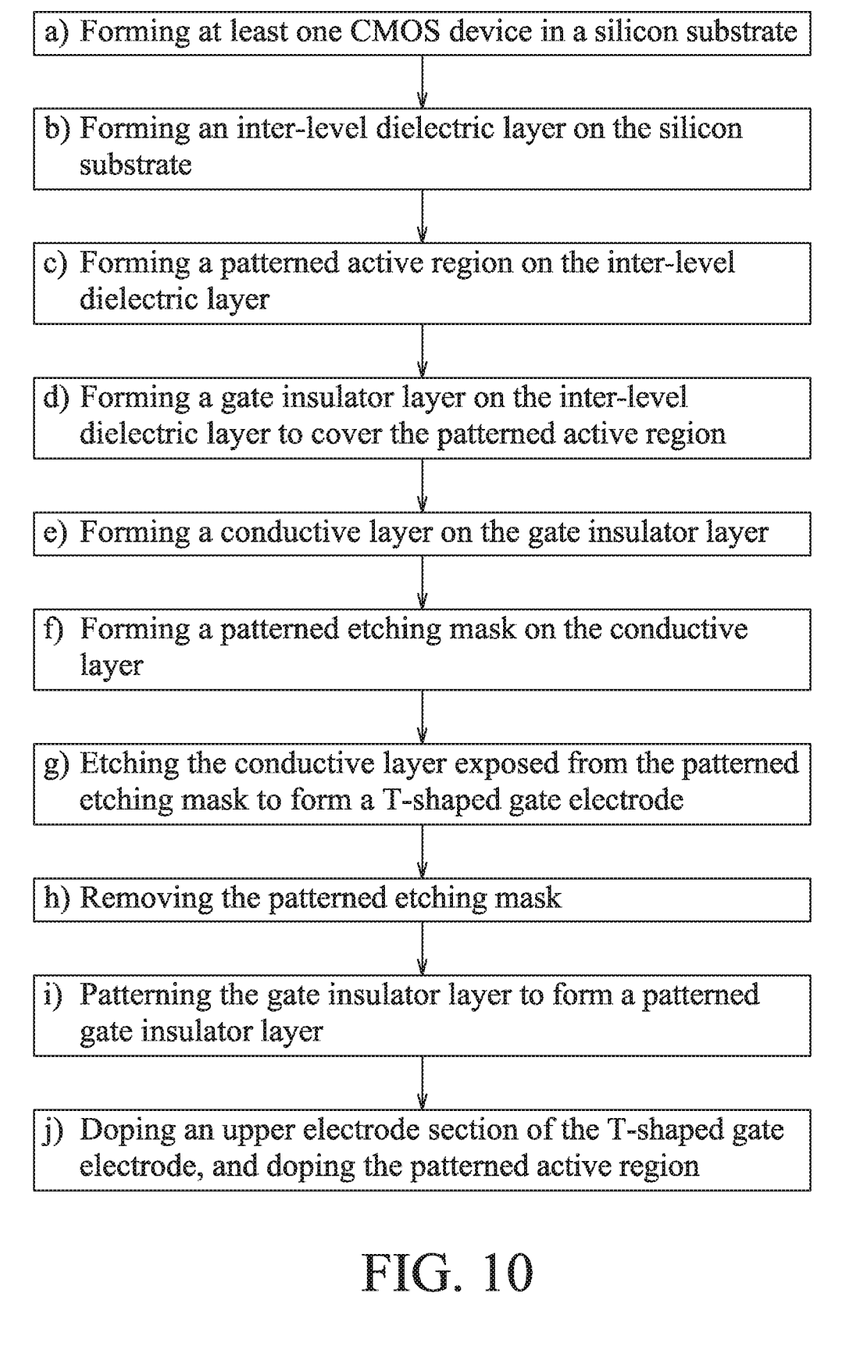
FIG. 10 is a flow diagram illustrating the method for fabricating the radio frequency integrated circuit.

As shown in FIG. 10, a method for fabricating the radio frequency integrated circuit includes steps a) to j).

Figure 1:
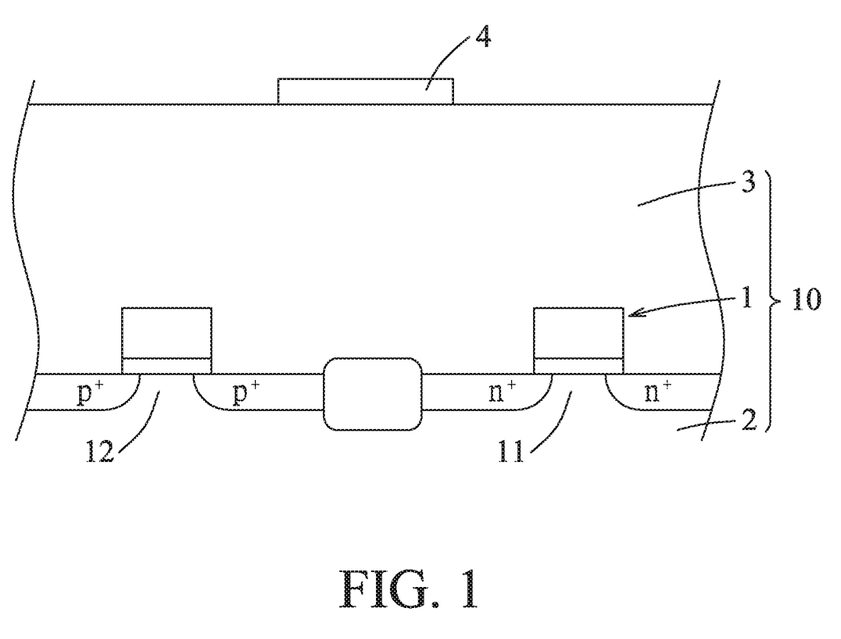
FIGS. 1 to 9 are schematic views illustrating consecutive steps of a method for fabricating a radio frequency integrated circuit according to an embodiment of the disclosure.

In step a), the at least one CMOS device 1 is formed in the silicon substrate 2, as shown in FIG. 1. The CMOS device 1 may have two channels 11, 12 which may each contain monocrystalline silicon or contain silicon and germanium. Since the process for forming the CMOS device 1 is well known in the art, the details thereof is omitted for the sake of brevity.

In step b), the inter-level dielectric layer 3 is formed on the silicon substrate 2 to cover the at least one CMOS device 1 (see FIG. 1). The inter-level dielectric layer 3 may be formed by depositing a silicon dioxide layer using plasma enhanced chemical vapor deposition, followed by chemical-mechanical polishing.

In step c), a patterned active region 4 is formed on the inter-level dielectric layer 3. The patterned active region 4 may be formed by depositing a material layer using chemical vapor deposition, followed by lithography and dry-etching. The patterned active region 4 (the material layer) may be made of a material selected from the group consisting of polysilicon, ZnO, IGZO, and ZnON. In an embodiment, the patterned active region 4 is made of polysilicon.

Figure 2:
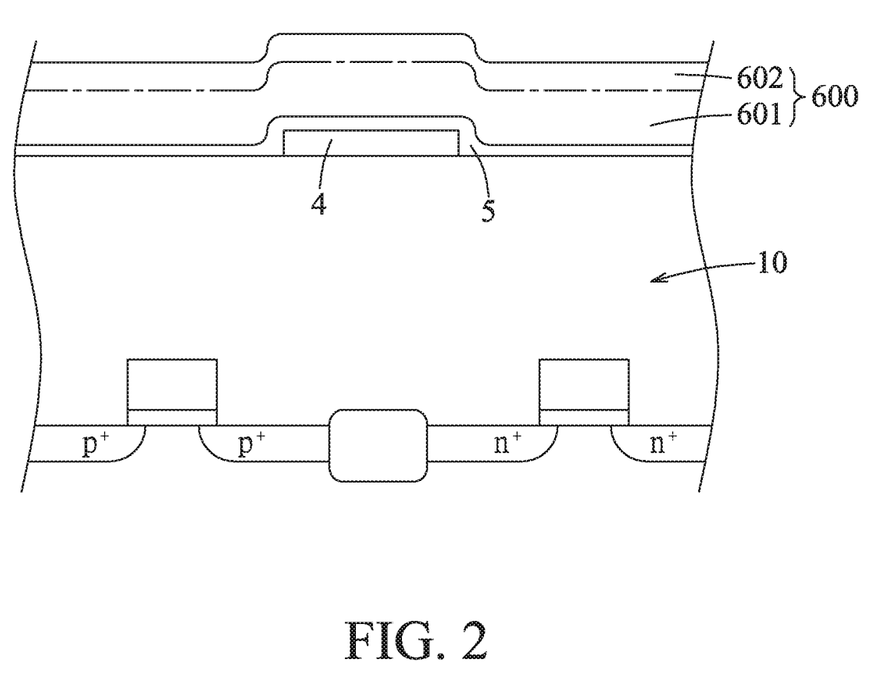

In step d), a gate insulator layer 5 is formed on the inter-level dielectric layer 3 to cover the patterned active region 4 (see FIG. 2). The gate insulator layer 5 may be formed by depositing gate oxide ($SiO_2$) using plasma enhanced chemical vapor deposition or atomic layer deposition.

Figure 3:
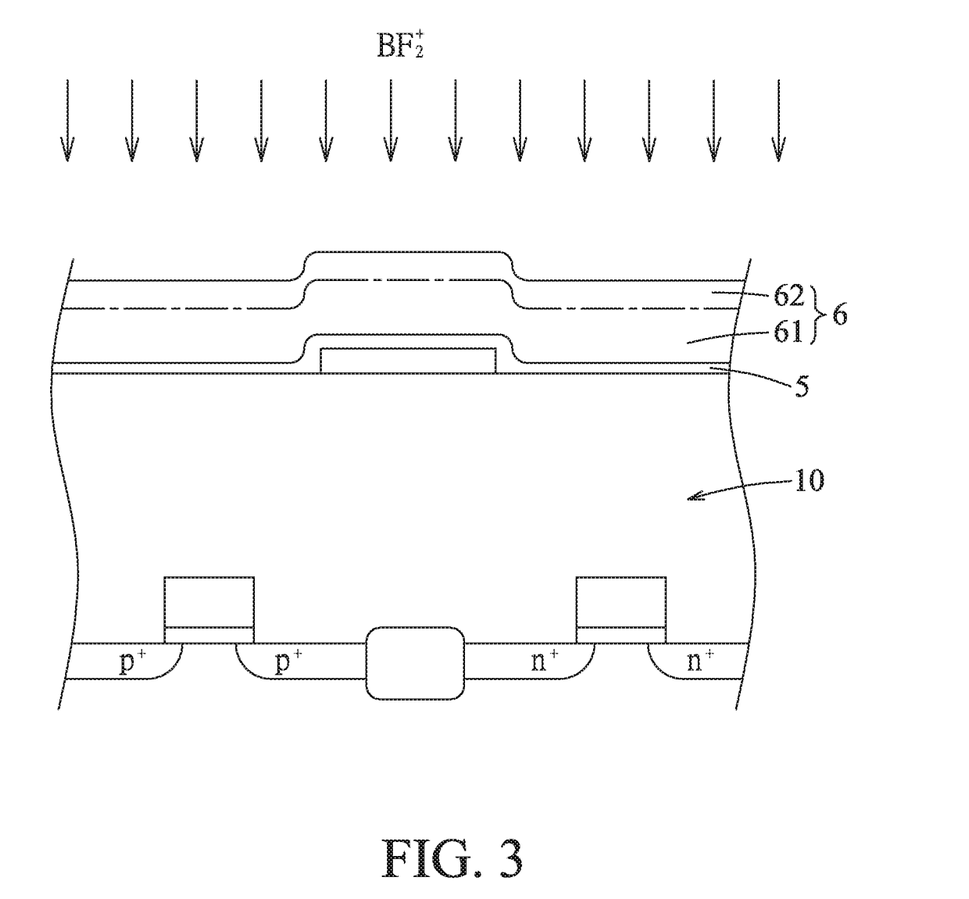

In step e), a conductive layer 6 is formed on the gate insulator layer 5 (see FIG. 3). The conductive layer 6 includes a lower conductive sublayer 61 which is attached to the gate insulator layer 5, and an upper conductive sublayer 62 which is stacked on the lower conductive sublayer 61 and which is made of a different material from that of the lower conductive sublayer 61.

In an embodiment shown in FIGS. 2 and 3, step e) may include sub-steps e1) and e2).

In sub-step e1), an $n^+$-doped polysilicon layer 600 is formed on the gate insulator layer 5. The $n^+$-doped polysilicon layer 600 has an upper portion 602, and a lower portion 601 serving as the lower conductive sublayer 61. The $n^+$-doped polysilicon layer 600 may be formed using plasma enhanced chemical vapor deposition or low pressure chemical vapor deposition.

In sub-step e2), the upper portion 602 is doped with boron ions to form the upper conductive sublayer 62. The boron ions may be $BF^{2+}$ ions.

In this embodiment, the lower and upper conductive sublayers 61, 62 are formed by doping the upper portion 602 of the $n^+$-doped polysilicon layer 600. In other embodiments, the lower and upper conductive sublayers 61, 62 may be formed by deposition of two different materials.

Figure 4:
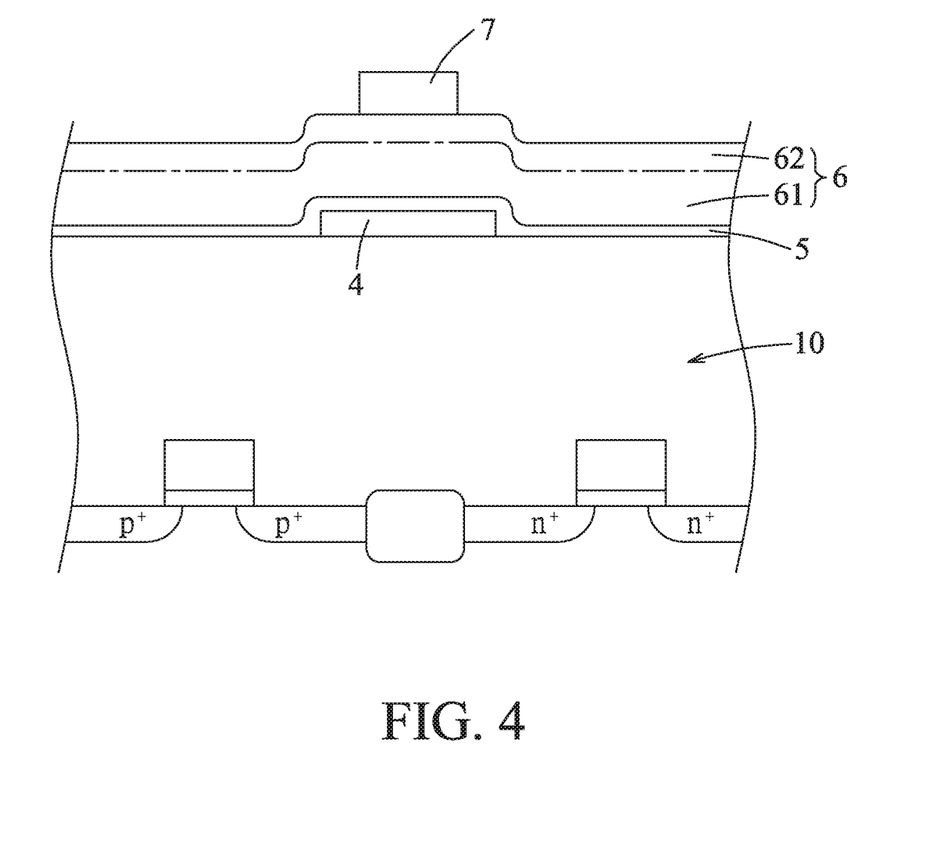

In step f), a patterned etching mask 7 is formed on the conductive layer 6 in a position corresponding to the patterned active region. 4 (see FIG. 4).

Figure 5:
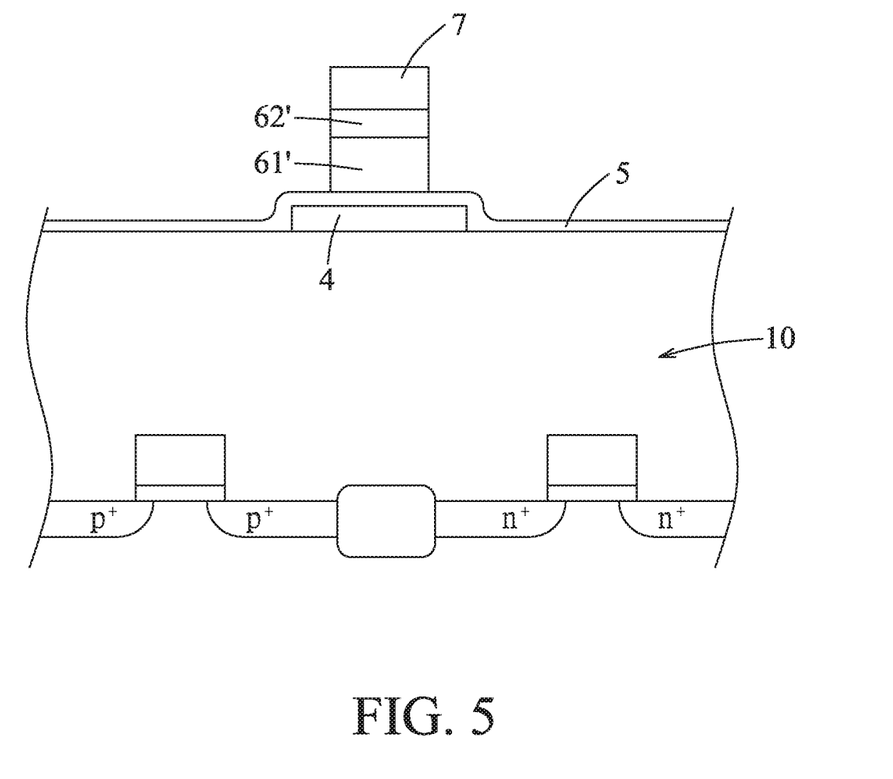
Figure 6:
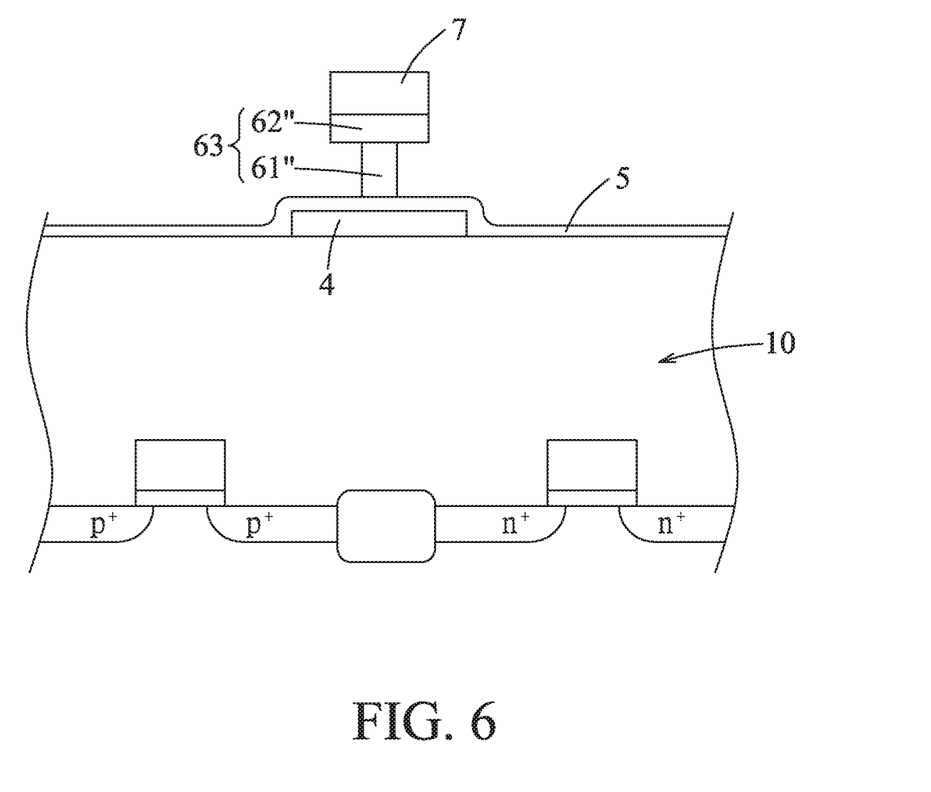

In step g), the conductive layer 6 exposed from the patterned etching mask 7 is etched to form the T-shaped gate electrode 63 (see FIGS. 4 to 6).

In an embodiment shown in FIGS. 4 to 6, the step g) may include sub-steps g1) and g2).

In sub-step g1), the conductive layer 6 exposed from the patterned etching mask 7 is subjected to anisotropic etching to form a patterned upper conductive sublayer 62' and a patterned lower conductive sublayer 61' both beneath the patterned etching mask 7 (see FIGS. 4 and 5).

Sub-step g2) is implemented after sub-step g1). In sub-step g2), the patterned upper conductive sublayer 62' and the patterned lower conductive sublayer 61' are subjected to isotropic and lateral etching with a higher etch selectivity to the patterned lower conductive sublayer 61' than to the upper conductive sublayer 62' and the gate insulator layer 5 to form the T-shaped gate electrode 63 (FIG. 6).

In an embodiment, sub-step g1) may be implemented using a $HBr/O_2/Cl_2$ plasma, and sub-step g2) may be implemented using a $Cl_2$ plasma.

Please note that the conductive layer 6 for forming the T-shaped gate electrode 63 is of a continuous crystal phase, and thus the T-shaped gate electrode 63 is less likely to deform after being used for a period of time.

Step h) is implemented after step g). In step h), the patterned etching mask 7 is removed.

Figure 7:
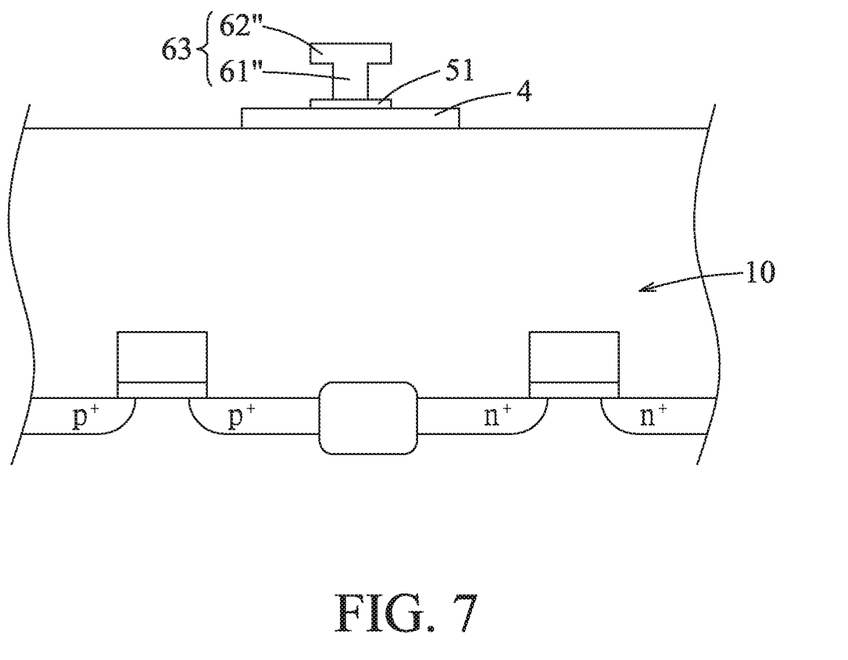

In step i), the gate insulator layer 5 is patterned to form a patterned gate insulator layer 51 interposed between the T-shaped gate electrode 63 and the patterned active region 4 (see FIG. 7). In an embodiment, step i) may be implemented using anisotropic fluorine based dry etching.

In step j), an upper electrode section 62" of the T-shaped gate electrode 63 is doped, and the patterned active region 4 is doped to form a source region 41 and a drain region 42 therein at two opposite sides of the T-shaped gate electrode 63 while a channel region 43 (i.e., the semiconductive channel 43 mentioned above) is formed between the source and drain regions 41, 42 and beneath the patterned gate insulator layer 51. Step j) may be implemented by $As^+$ ions implantation at a tilted-angle.

In an embodiment, the method may further include a step k) after step j). In step k), the passivation layer 8 is formed on the inter-level dielectric layer 3 to cover the T-shaped gate electrode 63 in a way that the two air spacers 64 are formed respectively beneath the two wing portions of the T-shaped gate electrode 63. The passivation layer 8 may be formed by sputtering or chemical vapor deposition of $SiO_2$.

In sum, the radio frequency integrated circuit made by the above-mentioned method may have a compact structure and a relatively smaller circuit area, and may be produced in a relative low cost. In addition, the T-shaped gate electrode 63 of the at least one thin film transistor 9 is of a continuous crystal phase, and is less likely to deform.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment (s), it is understood that this disclosure is not limited to the disclosed embodiments) but is intended to cover various arrangements included within the spirit and scope of the broadest interpretation so as to encompass all such modifications and equivalent arrangements.

What is claimed is:

1. A radio frequency integrated circuit comprising:
   a silicon CMOS substrate with at least one CMOS device buried therein;
   at least one thin film transistor formed on said silicon CMOS substrate and functioning as a radio frequency device, said thin film transistor including a T-shaped gate electrode; and a passivation layer formed on said silicon CMOS substrate to cover said T-shaped pate electrode in a way that two air spacers are formed respectively beneath two wing portions of said T-shaped gate electrode.

2. The radio frequency integrated circuit according to claim 1, wherein said thin film transistor has a semiconductive channel.

3. The radio frequency integrated circuit according to claim 2, wherein said semiconductive channel is made of a material selected from the group consisting of polysilicon, ZnO, IGZO, and ZnON.

4. The radio frequency integrated circuit according to claim 1, wherein said T-shaped gate electrode includes an n+-doped polysilicon lower electrode section, and a boron-doped polysilicon upper electrode section which has said wing portions and which is wider than said n+-doped polysilicon lower electrode section.

5. A method for fabricating a radio frequency integrated circuit comprising the steps of:
a) forming at least one CMOS device in a silicon substrate;
b) forming an inter-level dielectric layer on the silicon substrate to cover the at least one CMOS device;
c) forming a patterned active region on the inter-level dielectric layer;
d) forming a gate insulator layer on the inter-level dielectric layer to cover the patterned active region;
e) forming a conductive layer on the gate insulator layer, the conductive layer including a lower conductive sublayer which is attached to the gate insulator layer, and an upper conductive sublayer which is stacked on the lower conductive sublayer and which is made of a material different from that of the lower conductive sublayer;
f) forming a patterned etching mask on the conductive layer in a position corresponding to the patterned active region;
g) etching the conductive layer exposed from the patterned etching mask to form a T-shaped gate electrode;
h) after steps g), removing the patterned etching mask;
i) patterning the gate insulator layer to form a patterned gate insulator layer interposed between the T-shaped gate electrode and the patterned active region;
j) doping an upper electrode section of the T-shaped gate electrode, and doping the patterned active region to form a source region and a drain region therein at two opposite sides of the T-shaped gate electrode while a channel region is formed between the source and drain regions and beneath the patterned gate insulator layer; and
k) forming a passivation layer on the inter-level dielectric layer to cover the T-shaped gate electrode in a way that two air spacers are formed respectively beneath two wing portions of the T-shaped gate electrode.

6. The method according to claim 5, wherein step e) includes the sub-steps of:
e1) forming an n+-doped polysilicon layer on the gate insulator layer, the n+-doped polysilicon layer having an upper portion, and a lower portion that serves as the lower conductive sublayer; and
e2) doping the upper portion with boron ions to form the upper conductive sublayer.

7. The method according to claim 6, wherein step g) includes the sub-steps of:
g1) anisotropic etching the conductive layer exposed from the patterned etching mask to form a patterned upper conductive sublayer and a patterned lower conductive sublayer both beneath the patterned etching mask; and
g2) after sub-step g1), isotropic and lateral etching the patterned upper conductive sublayer and the patterned lower conductive sublayer with a higher etch selectivity to the patterned lower conductive sublayer than to the upper conductive sublayer and the gate insulator layer to form the T-shaped gate electrode.

8. The method according to claim 7, wherein sub-step g1) is implemented using a $HBr/O_2/Cl_2$ plasma, and sub-step g2) is implemented using a $Cl_2$ plasma.

9. The method according to claim 5, wherein the patterned active region is made of a material selected from the group consisting of polysilicon, ZnO, IGZO, and ZnON.

10. The method according to claim 5, wherein the patterned active region is made of polysilicon.

* * * * *

UNITED STATES PATENT AND TRADEMARK OFFICE
CERTIFICATE OF CORRECTION

PATENT NO. : 11,257,845 B2
APPLICATION NO. : 16/940093
DATED : February 22, 2022
INVENTOR(S) : Horng-Chih Lin et al.

Page 1 of 1

It is certified that error appears in the above-identified patent and that said Letters Patent is hereby corrected as shown below:

In the Claims

Claim 1, Line 2, "pate" should be changed to "gate".

Signed and Sealed this
Twenty-sixth Day of July, 2022

Katherine Kelly Vidal
*Director of the United States Patent and Trademark Office*